(12) United States Patent
Verma et al.

(10) Patent No.: US 7,546,573 B1
(45) Date of Patent: Jun. 9, 2009

(54) SEMICONDUCTOR DEVICE PATTERN GENERATION

(75) Inventors: Guarav Verma, Sunnyvale, CA (US); Rui-Fang Shi, Cupertino, CA (US)

(73) Assignee: KLA-Tencor Corporation, San Jose, CA (US)

( * ) Notice: Subject to any disclaimer, the term of this patent is extended or adjusted under 35 U.S.C. 154(b) by 384 days.

(21) Appl. No.: 11/447,619

(22) Filed: Jun. 6, 2006

(51) Int. Cl.
 *G06F 17/50* (2006.01)
(52) U.S. Cl. .......................................... 716/19; 716/21
(58) Field of Classification Search ............... 716/1–19, 716/21
 See application file for complete search history.

(56) References Cited

U.S. PATENT DOCUMENTS

| | | | | |
|---|---|---|---|---|
| 5,316,896 A | * | 5/1994 | Fukuda et al. | 430/322 |
| 5,644,390 A | * | 7/1997 | Yasuzato | 356/121 |
| 5,792,596 A | * | 8/1998 | Yasuzato et al. | 430/327 |
| 6,081,658 A | | 6/2000 | Rieger et al. | |
| 6,187,483 B1 | * | 2/2001 | Capodieci et al. | 430/5 |
| 6,310,679 B1 | * | 10/2001 | Shiraishi | 355/53 |
| 7,295,695 B1 | * | 11/2007 | Dayal | 382/145 |
| 2002/0123866 A1 | * | 9/2002 | Lin | 703/2 |
| 2003/0071262 A1 | | 4/2003 | Weiner | |
| 2003/0140330 A1 | * | 7/2003 | Tanaka et al. | 716/19 |
| 2004/0088149 A1 | | 5/2004 | Cobb | |
| 2005/0008949 A1 | | 1/2005 | Dulman | |
| 2006/0057475 A1 | | 3/2006 | Liebmann | |
| 2006/0170617 A1 | * | 8/2006 | Latypov et al. | 345/32 |
| 2006/0200790 A1 | * | 9/2006 | Shang et al. | 716/19 |
| 2006/0277520 A1 | * | 12/2006 | Gennari | 716/21 |

* cited by examiner

*Primary Examiner*—Sun J Lin
(74) *Attorney, Agent, or Firm*—Luedeka, Neely & Graham, P.C.

(57) ABSTRACT

In one embodiment, a computer system a processor and a memory module comprising logic instructions stored on a computer readable medium which. When executed, the logic instructions configure a processor to create a reticle pattern for use in a lithography process, apply an orthogonalization process to the reticle pattern to create an orthogonalized reticle pattern, and use the orthogonalized reticle pattern in an optical proximity correction process.

5 Claims, 5 Drawing Sheets

SEMICONDUCTOR DEVICE PATTERN GENERATION

BACKGROUND

The subject matter described herein relates to surface inspection techniques, and more particularly to semiconductor device pattern generation.

Photolithography (also referred to as lithography) is commonly used during formation of integrated circuits on semiconductor wafers. In the context of design and manufacture of semiconductor devices, the terms lithography or photolithography refer to the process of patterning openings in photosensitive materials (sometimes referred to as photoresists or resists) which define small areas in which a silicon base material is modified by a specific operation in a sequence of processing steps.

A basic photolithography system includes a radiation source, a stencil or photo mask containing the pattern to be transferred to a wafer, one or more lenses, and a means for aligning existing patterns on the wafer with patterns on the mask. A form of radiant energy such as, for example, ultraviolet light may be passed through a radiation patterning tool and onto a radiation-sensitive material (such as, for example, photoresist) associated with a semiconductor wafer. The radiation patterning tool may be referred to as a photomask or a reticle.

The term photomask traditionally is understood to refer to masks which define a pattern for an entirety of a wafer, and the term reticle is traditionally understood to refer to a patterning tool which defines a pattern for only a portion of a wafer. However, the terms photomask (or more generally mask) and reticle are frequently used interchangeably in modern parlance, so that either term can refer to a radiation patterning tool that encompasses either a portion or an entirety of a wafer. For purposes of interpreting this disclosure and the claims that follow, the term reticle is utilized generically to refer to any radiation patterning tool, inclusive of tools which define a pattern for only a portion of a wafer and tools which define a pattern for an entirety of a wafer.

Reticles contain light restrictive regions (for example, totally opaque or attenuated/half-toned regions) and light transmissive regions (for example, totally transparent regions) formed in a desired pattern. A grating pattern, for example, can be used to define parallel-spaced conductive lines on a semiconductor wafer. As discussed previously, the wafer is provided with a layer of radiation-sensitive material such as, for example, photoresist.

As described above, radiation from the radiation source passes through the reticle onto the layer of photoresist and transfers a pattern defined by the radiation patterning tool onto the photoresist. The photoresist is then developed to remove either the exposed portions of photoresist for a positive photoresist or the unexposed portions of the photoresist for a negative photoresist. The remaining patterned photoresist can then be used as a mask on the wafer during a subsequent semiconductor fabrication step, such as, for example, ion implantation or etching relative to materials in the wafer proximate the photoresist.

Various forms of interference such as, e.g., diffraction effects, can cause the geometry created in the photoresist to deviate from the geometry the reticle was intended create on the photoresist. The deviation becomes increasingly problematic as semiconductor design uses increasingly smaller line widths.

BRIEF DESCRIPTION OF THE DRAWINGS

The detailed description is described with reference to the accompanying figures.

DETAILED DESCRIPTION

Described herein are exemplary systems and methods for semiconductor device pattern generation. In the following description, numerous specific details are set forth in order to provide a thorough understanding of various embodiments. However, it will be understood by those skilled in the art that the various embodiments may be practiced without the specific details. In other instances, well-known methods, procedures, components, and circuits have not been described in detail so as not to obscure the particular embodiments.

Various methods described herein may be embodied as logic instructions on a computer-readable medium. When executed on a processor the logic instructions cause a processor to be programmed as a special-purpose machine that implements the described methods. The processor, when configured by the logic instructions to execute the methods described herein, constitutes structure for performing the described methods.

Figure 1:
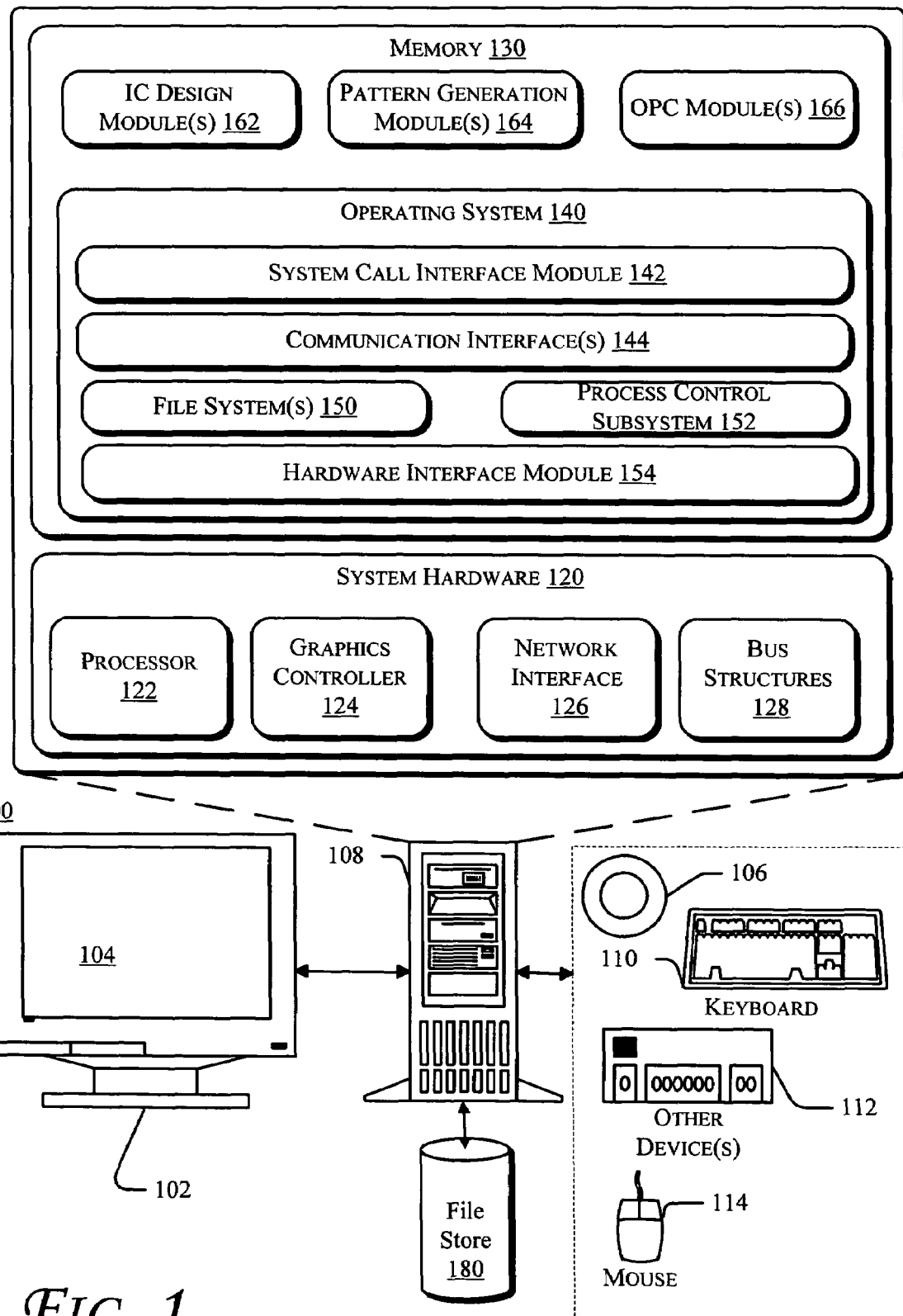
FIG. 1 is a schematic illustration of a computing system which may be used in semiconductor device pattern generation.

FIG. 1 is a schematic illustration of a computing system 100 adapted to perform semiconductor device pattern generation operations according to an embodiment. In one embodiment, system 100 includes a computing device 108 and one or more accompanying input/output devices including a display 102 having a screen 104, one or more speakers 106, a keyboard 110, one or more other I/O device(s) 112, and a mouse 114. The other I/O device(s) 112 may include a touch screen, a voice-activated input device, a track ball, and any other device that allows the system 100 to receive input from a user.

The computing device 108 includes system hardware 120 and memory 130, which may be implemented as random access memory and/or read-only memory. A file store 180 may be communicatively coupled to computing device 108. File store 180 may be internal to computing device 108 such as, e.g., one or more hard drives, CD-ROM drives, DVD-ROM drives, or other types of storage devices. File store 180 may also be external to computer 108 such as, e.g., one or more external hard drives, network attached storage, or a separate storage network.

System hardware 120 may include one or more processors 122, video controllers 124, network interfaces 126, and bus structures 128. In one embodiment, processor 122 may be embodied as an Intel® Pentium IV® processor available from Intel Corporation, Santa Clara, Calif., USA. As used herein, the term "processor" means any type of computational element, such as but not limited to, a microprocessor, a microcontroller, a complex instruction set computing (CISC) microprocessor, a reduced instruction set (RISC) microprocessor, a very long instruction word (VLIW) microprocessor, or any other type of processor or processing circuit.

Graphics controller 124 may function as an adjunction processor that manages graphics and/or video operations. Graphics controller 124 may be integrated onto the motherboard of computing system 100 or may be coupled via an expansion slot on the motherboard.

In one embodiment, network interface 126 could be a wired interface such as an Ethernet interface (see, e.g., Institute of Electrical and Electronics Engineers/IEEE 802.3-2002) or a wireless interface such as an IEEE 802.11a, b or g-compliant interface (see, e.g., IEEE Standard for IT-Telecommunications and information exchange between systems LAN/MAN—Part II: Wireless LAN Medium Access Control (MAC) and Physical Layer (PHY) specifications Amendment 4: Further Higher Data Rate Extension in the 2.4 GHz Band, 802.11 G-2003). Another example of a wireless interface would be a general packet radio service (GPRS) interface (see, e.g., Guidelines on GPRS Handset Requirements, Global System for Mobile Communications/GSM Association, Ver. 3.0.1, December 2002).

Bus structures 128 connect various components of system hardware 128. In one embodiment, bus structures 128 may be one or more of several types of bus structure(s) including a memory bus, a peripheral bus or external bus, and/or a local bus using any variety of available bus architectures including, but not limited to, 11-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

Memory 130 may include an operating system 140 for managing operations of computing device 108. In one embodiment, operating system 140 includes a hardware interface module 154 that provides an interface to system hardware 120. In addition, operating system 140 may include a file system 150 that manages files used in the operation of computing device 108 and a process control subsystem 152 that manages processes executing on computing device 108.

Operating system 140 may include (or manage) one or more communication interfaces that may operate in conjunction with system hardware 120 to transceive data packets and/or data streams from a remote source. Operating system 140 may further include a system call interface module 142 that provides an interface between the operating system 140 and one or more application modules resident in memory 130. Operating system 140 may be embodied as a UNIX operating system or any derivative thereof (e.g., Linux, Solaris, etc.) or as a Windows® brand operating system, or other operating systems.

In various embodiments, the computing device 108 may be embodied as a personal computer, a laptop computer, a personal digital assistant, a mobile telephone, an entertainment device, or another computing device.

Memory 130 includes one or more application modules to execute one or more applications on computing system 100. In one embodiment, memory 130 may include one or more integrated circuit (IC) design modules 162, one or more pattern generation modules 164, and one or more optical proximity correction modules 166. Features of modules 162, 164, 166 are described herein.

Figure 2:
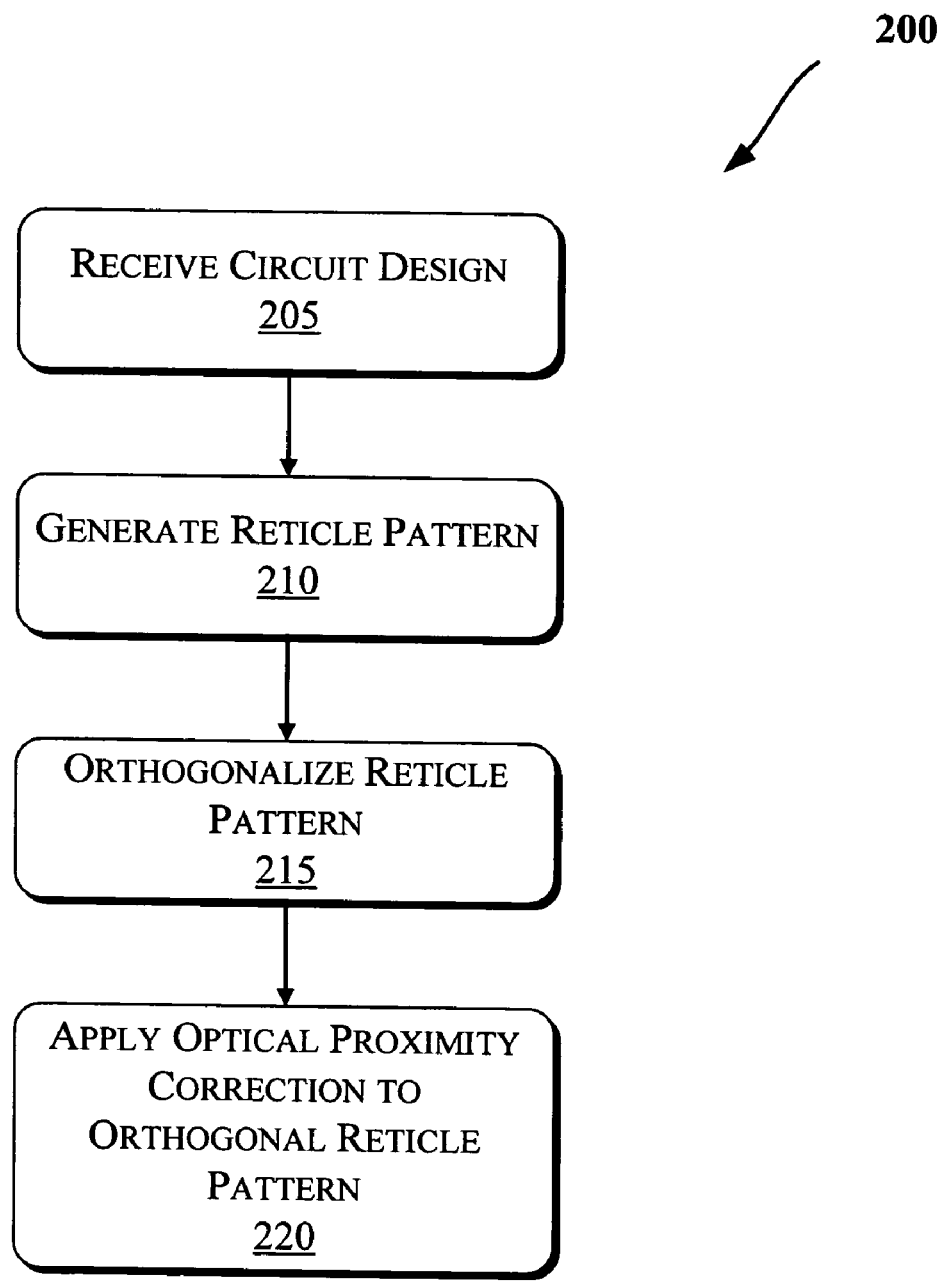
FIG. 2 is a flowchart illustrating operations in one embodiment of a method for semiconductor device pattern generation.

FIG. 2 is a flowchart illustrating operations in one embodiment of a method for semiconductor device pattern generation. In one embodiment, the operations of FIG. 2 may be performed by the pattern generation module(s) 164 that reside in the memory 130 of computing system 100.

Figure 3:
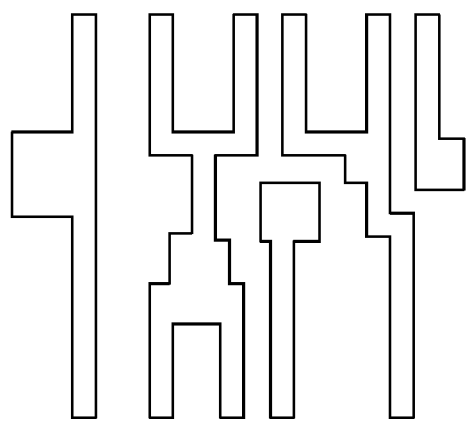
FIG. 3 is a schematic depiction of a representative semiconductor design.

Referring to FIG. 2, at operation 205 a circuit design is received. In one embodiment, the circuit design may have been generated by an IC circuit module 162. IC design module 162 may be embodied as any computer-based IC design system that enables IC designers to generate a circuit layout. In one embodiment, IC design module may implement a high-level IC description language such as, e.g., VHDL (Very high-speed integrated circuit Hardware Description Language) or the Verilog hardware description language. These and other high-level IC description languages permit a circuit designer to design and simulate circuits by using high-level code to describe the structure and/or behavior of the circuit being designed. FIG. 3 is a schematic depiction of a representative semiconductor design.

Figure 4:
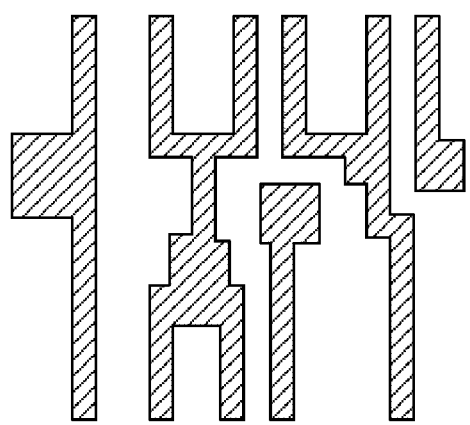
FIG. 4 is a schematic depiction of a representative semiconductor design imparted onto a wafer.
Figure 5:
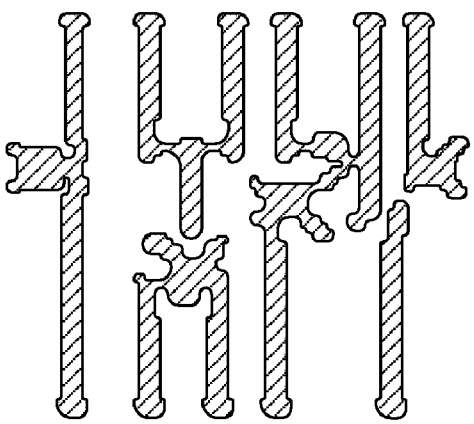
FIG. 5 is a schematic depiction of an inverse transform of the image on the wafer.

At operation 210 a reticle pattern is generated from the circuit design received in operation 205. In one embodiment, generating a reticle pattern may include using design rules to generate an inverse transform of the circuit design received in operation 205. In an alternate embodiment, the circuit design received in operation 205 may first be transformed to a representation of a post-lithography image on a wafer, which may then be inversely transformed to generate a reticle pattern. For example, FIG. 4 is a schematic depiction of a representative semiconductor design imparted onto a wafer, and FIG. 5 is a schematic depiction of an inverse transform of the image on the wafer.

Figure 6:
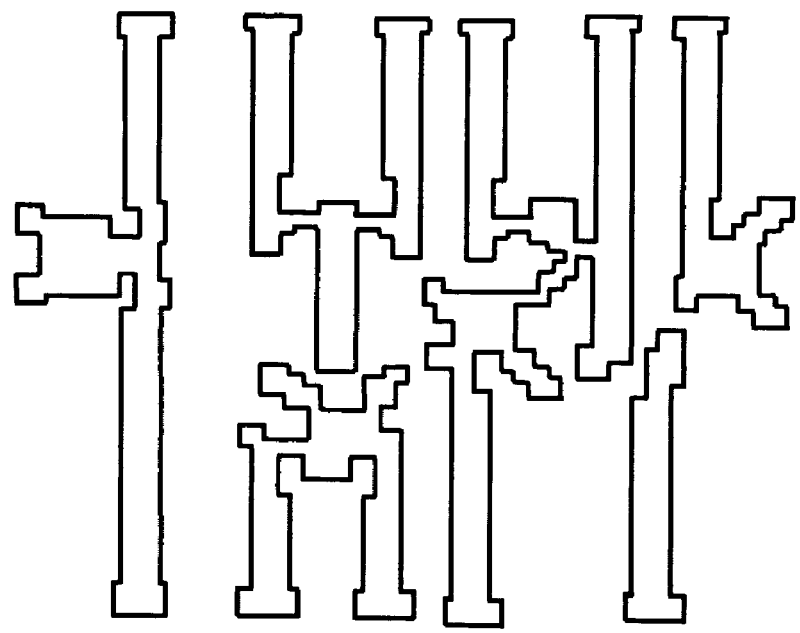
FIG. 6 is a schematic depiction of an orthogonalized image of the inverse transform depicted in FIG. 5.
Figure 7:
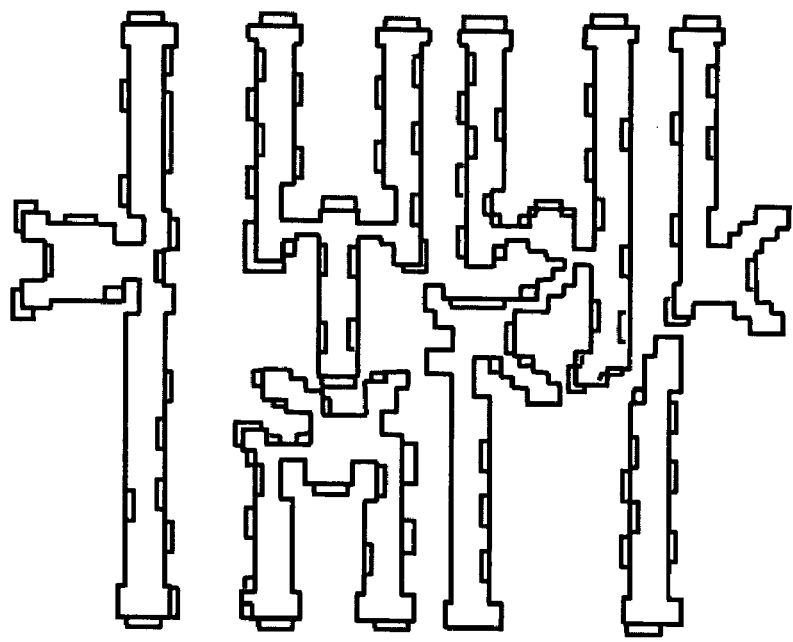
FIG. 7 is a schematic depiction of an inverse transform of the orthogonalized image of FIG. 6 after an optical proximity correction operation.

At operation 215 the reticle pattern generated in operation 210 is orthogonalized. In one embodiment, the orthogonalization process implemented in operation 215 converts rounded features such as, e.g., corners, ellipses, and the like into linear features by applying an approximation algorithm to the features. FIG. 6 is a schematic depiction of an orthogonalized image of the inverse transform depicted in FIG. 5.

At operation 220 an optical proximity correction (OPC) technique is applied to the orthogonal reticle pattern generated in operation 215. In one embodiment, the orthogonal reticle pattern generated in operation 215 is input as a seed into an OPC algorithm. Because the orthogonal reticle pattern generated in operation 215 is not constrained by the original design intent, an OPC algorithm will be more likely to overcome solution convergence issues. Also, because the input patterns are orthogonal, the reticle pattern is compatible with existing OPC algorithms.

OPC refers to a process of modifying the polygons that are drawn by circuit designers to compensate for non-ideal properties of the lithography process. During an OPC process the reticle design may be modified to improve the reproduction of critical geometric features. In one embodiment, this may be done by dividing polygon edges into small segments and moving the segments around, and by adding additional small polygons to strategic locations in the layout. The addition of OPC features to the mask layout permits tighter design rules and significantly improves process reliability and yield. FIG.

7 is a schematic depiction of an inverse transform of the orthogonalized image of FIG. 6 after an optical proximity correction operation.

In one embodiment, the OPC process may be implemented by OPC module(s) 166. Numerous OPC modules are commercially available including, but not limited to the Protues correction processor from Synopsys Products of Mountain View, Calif., USA, or the Virtuoso® Resolution Enhancement Suite from Cadence Design Systems of San Jose, Calif., USA.

Figure 8:
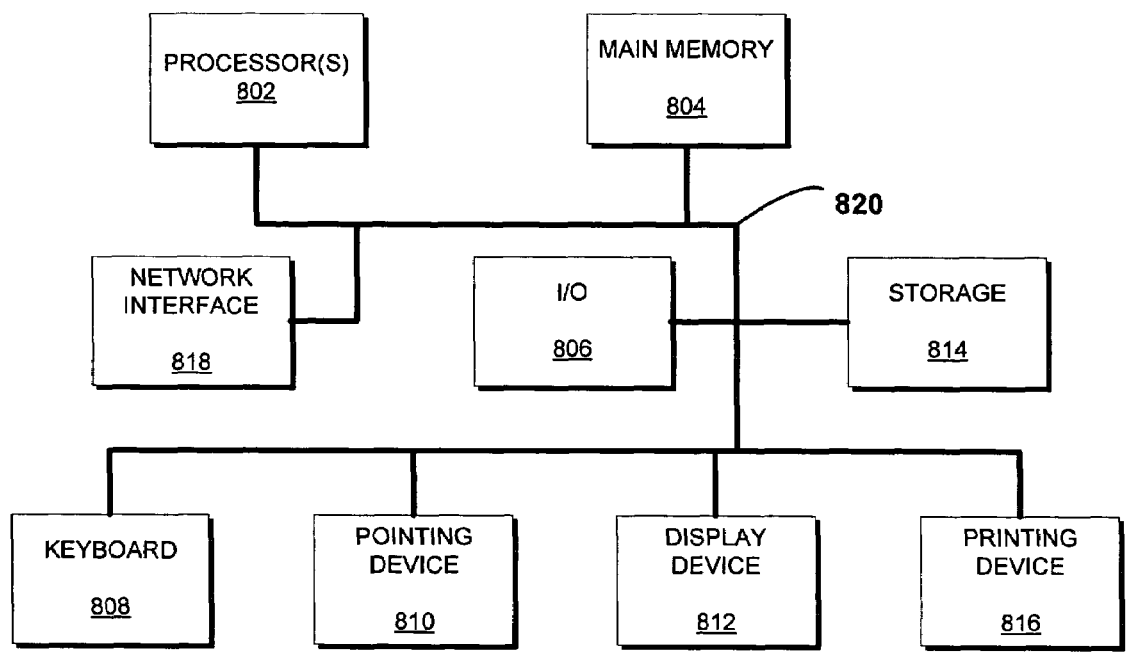
FIG. 8 is a schematic illustration of a computing environment.

FIG. 8 illustrates a block diagram of computer system 800 that may be utilized in various embodiments of the invention. In an embodiment, the system 800 may be utilized instead of or in addition to the computing device 120 in system 100. The system 800 may include one or more processors 802, a main memory 804, an input/output (I/O) controller 806, a keyboard 808, a pointing device 810 (e.g., mouse, track ball, pen device, or the like), a display device 812, a mass storage 814 (e.g., a nonvolatile storage such as a hard disk, an optical drive, or the like), and a network interface 818. Additional input/output devices, such as a printing device 816, may be included in the system 800 as desired. As illustrated in FIG. 8, the various components of the system 800 may communicate through a system bus 820 or similar architecture.

In accordance with an embodiment of the invention, the processor 802 may be a complex instruction set computer (CISC) microprocessor, a reduced instruction set computing (RISC) microprocessor, a very long instruction word (VLIW) microprocessor, a processor implementing a combination of instruction sets, or the like.

Moreover, the network interface 818 may provide communication capability with other computer systems on a same local network, on a different network connected via modems or the like to the present network, or to other computers across the Internet. In various embodiments of the invention, the network interface 818 may be implemented by utilizing technologies including, but not limited to, Ethernet, Fast Ethernet, Gigabit Ethernet (such as that covered by the Institute of Electrical and Electronics Engineers (IEEE) 801.1 standard), wide-area network (WAN), leased line (such as T1, T3, optical carrier 3 (OC3), or the like), analog modem, digital subscriber line (DSL and its varieties such as high bit-rate DSL (HDSL), integrated services digital network DSL (IDSL), or the like), cellular, wireless networks (such as those implemented by utilizing the wireless application protocol (WAP)), time division multiplexing (TDM), universal serial bus (USB and its varieties such as USB II), asynchronous transfer mode (ATM), satellite, cable modem, and/or FireWire.

Moreover, the computer system 800 may utilize operating systems such as Solaris, Windows (and its varieties such as CE, NT, 2000, XP, ME, Vista, or the like), HP-UX, IBM-AIX, PALM, UNIX, Berkeley software distribution (BSD) UNIX, Linux, Apple UNIX (AUX), Macintosh operating system (Mac OS) (including Mac OS X), or the like. Also, in certain embodiments of the invention, the computer system 800 may be a general purpose computer capable of running any number of applications.

Reference in the specification to "one embodiment" or "an embodiment" means that a particular feature, structure, or characteristic described in connection with the embodiment is included in at least an implementation. The appearances of the phrase "in one embodiment" in various places in the specification may or may not be all referring to the same embodiment.

Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. A method, comprising the sequential steps of:
creating a reticle pattern for use in a lithography process by creating an inverse transform of a portion of a semiconductor device design pattern with a computer processor;
applying an orthogonalization process to the reticle pattern to create an orthogonalized reticle pattern; and
using the orthogonalized reticle pattern in an optical proximity correction process.

2. A method for creating a mask for use in defining a portion of a semiconductor device design pattern on a wafer, the method comprising the sequential steps of:
creating a semiconductor device design pattern as it should look on the wafer,
modifying the semiconductor device design pattern as it should look on the wafer with an inverse transform of at least one process step with a computer processor, where the inverse transform converts the semiconductor device design pattern as it should look on the wafer into a semiconductor device design pattern as it would look prior to the at least one process step, where the at least one process step includes projecting the semiconductor device design pattern onto photoresist on the wafer,
orthogonalizing the semiconductor device design pattern as it would look prior to the at least one process step by converting all rounded edges to straight lines, where adjacent ones of the straight lines all meet at right angles,
applying optical proximity correction to the orthogonalized semiconductor device design pattern as it would look prior to the at least one process step, and
creating a reticle having as an image the optical proximity corrected orthogonalized semiconductor device design pattern as it would look prior to the at least one process step.

3. The method of claim 2, wherein the at least one process step also includes at least one of developing the photoresist to create voids in the photoresist according to the image on the reticle, etching the wafer through the voids, doping the wafer through the voids, and forming a layer on the wafer through the voids.

4. A computer program product comprising logic instructions stored on a computer readable medium which, when executed, configure a processor to sequentially:
create a reticle pattern for use in a lithography process by creating an inverse transform of a portion of a semiconductor device design pattern;
apply an orthogonalization process to the reticle pattern to create an orthogonalized reticle pattern; and
use the orthogonalized reticle pattern in an optical proximity correction process.

5. A computer system, comprising:
a processor;
a memory module comprising logic instructions stored on a computer readable medium which, when executed, configure the processor to sequentially:
create a reticle pattern for use in a lithography process by creating an inverse transform of a portion of a semiconductor device design pattern;
apply an orthogonalization process to the reticle pattern to create an orthogonalized reticle pattern; and
use the orthogonalized reticle pattern in an optical proximity correction process.

* * * * *